US007084051B2

(12) United States Patent
Ueda

(10) Patent No.: US 7,084,051 B2
(45) Date of Patent: Aug. 1, 2006

(54) MANUFACTURING METHOD FOR SEMICONDUCTOR SUBSTRATE AND MANUFACTURING METHOD FOR SEMICONDUCTOR DEVICE

(75) Inventor: Takashi Ueda, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/457,013

(22) Filed: Jun. 9, 2003

(65) Prior Publication Data

US 2004/0018701 A1    Jan. 29, 2004

(30) Foreign Application Priority Data

Jun. 7, 2002    (JP)    ............................. 2002-167399

(51) Int. Cl.
*H10L 21/26* (2006.01)

(52) U.S. Cl. .................. 438/518; 438/16; 438/285; 438/507; 438/508; 438/522; 438/526; 438/528; 438/530; 438/973; 216/2; 216/60; 257/E21.12

(58) Field of Classification Search ................ 438/522, 438/526, 530, 660, 663, 766, 795, 933, FOR. 291, 438/FOR. 292, FOR. 394, FOR. 407, 285, 438/507, 508, 518, 973, FOR. 101, FOR. 142, 438/FOR. 160, FOR. 241, FOR. 257, FOR. 408, 438/16; 216/2, 60; 257/E21.12

See application file for complete search history.

(56) References Cited

U.S. PATENT DOCUMENTS

| 4,500,388 | A | * | 2/1985 | Ohmura et al. | ................. 117/8 |
| 5,432,104 | A | * | 7/1995 | Sato | ........................... 438/366 |
| 5,461,243 | A | | 10/1995 | Ek et al. | |

(Continued)

FOREIGN PATENT DOCUMENTS

JP    9-82944 A    3/1997

(Continued)

OTHER PUBLICATIONS

Welser et al, "Strain Dependence of the Performance Enhancement in Strained-Si n-MOSFETs", IEDM, IEEE, 1994, pp. 373-376.

(Continued)

*Primary Examiner*—George Fourson
*Assistant Examiner*—Joannie Adelle Garcia
(74) *Attorney, Agent, or Firm*—Nixon & Vanderhye, P.C.

(57) ABSTRACT

A purpose of the invention is to provide a manufacturing method for a semiconductor substrate in which a high quality strained silicon channel can easily be formed without sacrificing the processing efficiency of a wafer and to provide a manufacturing method for a semiconductor device wherein the driving performance of a PMOS transistor, in addition to that of an NMOS transistor, can be improved.

The invention provides a manufacturing method for a semiconductor substrate with the steps of: forming a SiGe film on the top surface of a substrate having a silicon monocrystal layer in the (111) or (110) plane direction as the surface layer; introducing buried crystal defects into the above described substrate by carrying out ion implantation and annealing treatment; and forming a semiconductor film on the above described SiGe film.

5 Claims, 4 Drawing Sheets

U.S. PATENT DOCUMENTS

| | | | |
|---|---|---|---|
| 5,461,250 A * | 10/1995 | Burghartz et al. | 257/347 |
| 5,476,813 A | 12/1995 | Naruse | |
| 5,534,713 A | 7/1996 | Ismail et al. | |
| 5,847,419 A | 12/1998 | Imai et al. | |
| 5,970,351 A * | 10/1999 | Takeuchi | 438/300 |
| 6,030,894 A * | 2/2000 | Hada et al. | 438/675 |
| 6,106,734 A * | 8/2000 | Shindo et al. | 216/2 |
| 6,171,905 B1 * | 1/2001 | Morita et al. | 438/257 |
| 6,429,061 B1 | 8/2002 | Rim | |
| 6,633,066 B1 | 10/2003 | Bae et al. | |
| 6,690,043 B1 | 2/2004 | Usuda et al. | |
| 6,723,541 B1 | 4/2004 | Sugii et al. | |
| 6,746,937 B1 | 6/2004 | Beaman | |
| 6,846,727 B1 * | 1/2005 | Fogel et al. | 438/479 |
| 6,890,835 B1 | 5/2005 | Chu et al. | |
| 2003/0160300 A1 | 8/2003 | Takenaka et al. | |
| 2004/0018701 A1 | 1/2004 | Ueada | |

FOREIGN PATENT DOCUMENTS

| | | |
|---|---|---|
| JP | 10-308503 A | 11/1998 |
| JP | 2001-110725 A | 4/2001 |

OTHER PUBLICATIONS

Auberton-Hervet et al, "Smart-Cut®: The Basic Fabrication Process for UNIBOND® SOI Wafers", IEICE Trans. Electron, vol. E80-C, No. 3, Mar. 1997, pp. 358-363.

Hirayama et al, "Low-Temperature Growth of High-Intensity Silicon Oxide Films by Oxygen Radical Generated in High-Density Krypton Plasma", IEDM Tech. Dig., IEEE, 1999.

Mii et al, "Extremely High Electron Mobility in Si/Ge$_x$Si$_{1-x}$ Structures Grown by Molecular Beam Epitaxy", Appl. Phys. Lett. 59 (13), Sep. 23, 1991, pp. 1611-1613.

Search Report V on the Trend of Multilayer Integration Technology, 98-KI-18, 1998, pp. 7-9 and 12.

Sato et al, "Hydrogen Annealed Silicon-on-Insulator", Appl. Phys. Lett. 65 (15), Oct. 10, 1994, pp. 1924-1926.

Alles, "Thin-Film SOI Emerges", IEEE Spectrum, Jun. 1997, pp. 37-45.

* cited by examiner

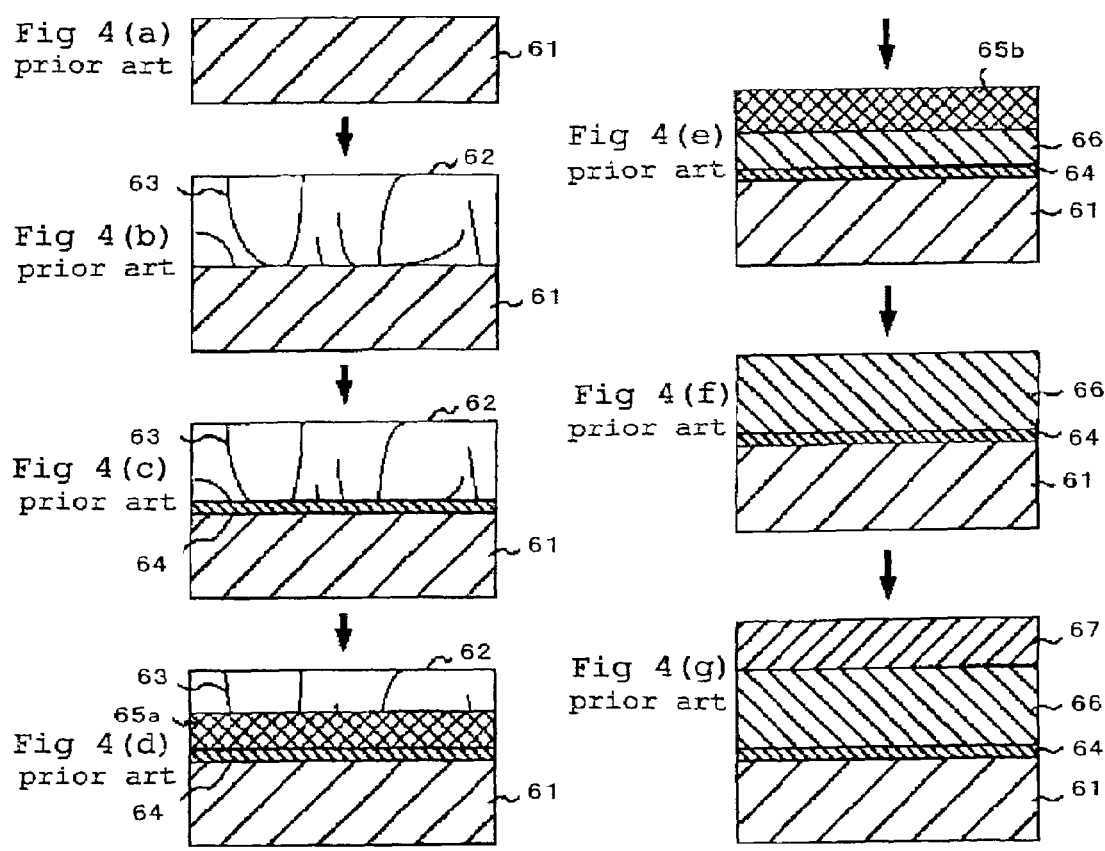

MANUFACTURING METHOD FOR SEMICONDUCTOR SUBSTRATE AND MANUFACTURING METHOD FOR SEMICONDUCTOR DEVICE

CROSS-REFERENCE TO RELATED APPLICATION

This application is related to Japanese application No. 2002-167399 filed on Jun. 7, 2002, whose priority is claimed under 35 USC § 119, the disclosure of which is incorporated by reference in its entirety.

BACKGROUND OF THE INVENTION

1. Field of the Invention

The present invention relates to a manufacturing method for a semiconductor substrate and a manufacturing method for a semiconductor device, in particular, to a manufacturing method for a high quality, high performance semiconductor substrate wherein strain is introduced due to the provision of a SiGe film and to a manufacturing method for a semiconductor device utilizing same.

Presently, reduction in the amount of power consumed by semiconductor devices, in particular by CMOS devices, is necessary for saving of natural resources. Until the present, the lowering of the operating voltage of MOS transistors has been achieved by securing the driving performance through miniaturization of the gate structure and through reduction in the thickness of the gate film.

Miniaturization of the transistor structure, however, requires great technological innovation for each generation and a further increase in the burden on developers, and increases in investment cost.

Therefore, the following techniques have been proposed as techniques for securing the driving performance of a MOS-type field-effect transistor at a low power supply voltage without regard to further miniaturization of the transistor: (1) a method for securing the driving performance of a transistor by adopting a complete depletion-type SOL transistor structure in order to reduce the S value (inclination of current relative to voltage in the sub-threshold region) and (2) a technique for increasing the driving performance of a transistor through the adoption of a strained silicon channel structure utilizing germanium.

However, an SOI-type transistor device according to technique (1) described above requires a complete depletion-type SOI structure. Therefore, the formation of transistors in a thin film 501 layer having a thickness of approximately 50 nm, or less, becomes necessary wherein a process technology is required that has a precision higher than that of the transistor process using a bulk substrate. In addition, an SOI layer is surrounded by a buried oxide film, from below, and by an element isolation oxide film, from the sides. Therefore, a problem arises that the design means utilized for a device in a bulk substrate cannot be utilized without change.

On the other hand, a transistor channel can be formed using a silicon layer having tensile strain and formed on a layer of eutectic crystal silicon (hereinafter specifically referred to as "SiGe") containing germanium of a differing lattice constant of which the strain has been relaxed. The driving performance of the transistor having a strained silicon channel structure according to technique (2) as above described is increased. That is to say, as is known from references (IEDM Tech. Digest, 1994, pp. 373–376, and the like), the effective mass of an electron is reduced in silicon having tensile strain in comparison with in unstrained silicon and mobility is increased and, therefore, the driving performance of a transistor can be increased through the utilization of this characteristic.

Many prior art references propose the application of the above described strained silicon in an NMOS transistor. In Japanese unexamined patent publication No. HEI9 (1997)-82944, for example, a buffer layer 52 having a concentration gradient is formed on a silicon substrate 51 so that lattice strain, caused by lattice mismatch between silicon film and SiGe film, is relaxed. A silicon layer 53 having a low lattice constant is deposited on top of the buffer layer in order to be utilized as a strained silicon channel, as shown in FIG. 3. Buffer layer 52 having a concentration gradient of germanium is utilized in this MOS transistor in order to suppress the occurrence of dislocations at the interface between the silicon substrate and the SiGe film so as to relax the stress due to lattice mismatch in the SiGe film. Accordingly, it is necessary to form a gentle concentration gradient in this MOS transistor and, consequently, a thick film buffer layer, on the order of μms, is required.

The deposition rate, however, of a SiGe film that utilizes epitaxial growth is usually as low as from approximately several nm per minute to several tens of nm per minute in order to secure monocrystallinity. Therefore, a long period of time is required for the deposition process, which can be problematic in terms of processing efficiency.

In addition, a technology utilizing ion implantation in order to control stress in a SiGe film is described in, for example, Japanese unexamined patent publication No. 2001-110725.

According to this method a SiGe film 62 is formed on a silicon substrate 61, as shown in FIGS. 4(a) and 4(b), and a first ion implantation of oxygen, nitrogen, or the like, into the interface between silicon substrate 61 and SiGe film 62 is carried out so as to form a stopper layer 64 for prevention of solid phase growth, as shown in FIG. 4(c). After that a second ion implantation of Ge, Si, or the like, is carried out so as to convert the lower portion of SiGe film 62, having a predetermined thickness, into an amorphous state, as shown in FIG. 4(d), and an amorphous layer 65a is converted by means of annealing into a monocrystal layer 66 wherein crystal defects have been reduced, as shown in FIG. 4(e). Then, as shown in FIG. 4(f), a third ion implantation of Ge, Si, or the like, is carried out so as to convert the upper layer portion of SiGe film 63 into an amorphous state and an amorphous layer 65b is converted into a monocrystal layer 66 by means of reannealing.

That is to say, implantations of ions having comparatively large masses and annealing are repeated a plurality of times on a SiGe film according to this method and, thereby, physical conversions, including conversion from a crystalline state to an amorphous state and recrystallization, are carried out. Accordingly, problems arise when the manufacturing process becomes complicated and, in addition, a high quality substrate in which crystal defects have been sufficiently reduced cannot be realized as the final substrate due to physical conversion into the amorphous state.

SUMMARY OF THE INVENTION

The present invention is provided in view of the above described problems and a purpose thereof is to provide a manufacturing method for a semiconductor substrate wherein a high quality strained silicon channel can easily be formed without sacrificing the processing efficiency of a wafer and to provide a manufacturing method for a semiconductor device wherein the driving performance of a PMOS transistor, in addition to that of an NMOS transistor, can be improved.

Accordingly the present invention provides a manufacturing method for a semiconductor substrate comprising the steps of:

forming of a SiGe film on a substrate of which the surface made of a silicon monocrystal layer in the (111) or (110) plane direction, introducing buried crystal defects within the above described substrate due to the carrying out of ion implantation and annealing treatment, forming a semiconductor film on the SiGe film.

Also, the present invention provides a manufacturing method for a semiconductor device comprising the step of forming a gate oxide film using ozone or oxygen radicals on the surface of the semiconductor film of the semiconductor substrate, which has been formed according to the above described manufacturing method for a semiconductor substrate.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 4(a) to (g) are principal schematic cross sectional views for explaining a manufacturing method for a semiconductor substrate according to the prior art.

FIG. 4(a) to (g) are principal schematic cross sectional views for explaining a manufacturing method for a semiconductor substrate according to the prior art.

DESCRIPTION OF THE PREFERRED EMBODIMENTS

Figure 1A:
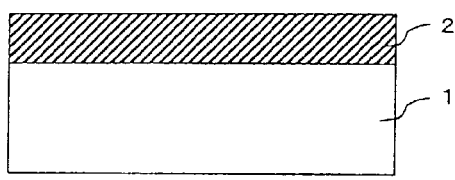
FIG. 1(a) to (f) are principal schematic cross sectional views for explaining a manufacturing method for a semiconductor substrate according to the present invention.

First, a SiGe film is formed on the top surface, made of a silicon monocrystal layer in the (111) or (110) plane direction, of a substrate according to the manufacturing method for a semiconductor substrate of the present invention.

The substrate is not necessarily limited to a silicon monocrystal substrate but, rather, may be a substrate having an SOI structure wherein a silicon monocrystal layer is provided, as long as the surface thereof has a silicon monocrystal layer in the (111) or (110) plane direction. Here, a substrate having a surface in the (111) plane or a surface in the (110) plane is used because the (111) surface has an atomic density per unit lattice that is 1.16 times higher, and the (110) surface has an atomic density per unit lattice that is 1.42 times higher, than that of a (100) surface crystal and the dislocation lines extending from the crystal defects do not easily grow. Accordingly, growth in the dislocation lines from the below described crystal defects to the surface of the SiGe film can ultimately be suppressed so that a high quality SiGe film without strain can be secured.

A SiGe film formed on a silicon substrate has compressive stress wherein strain energy has not been released. That is to say, a germanium film formed on a silicon substrate usually has a lattice mismatch of approximately 4% and receives a compressive stress from the base silicon substrate due to this so that a compressive stress and/or crystal in a strained form is, inherent in the SiGe film. Here, the SiGe film deposited on a surface in the (111) plane or in the (110) plane usually maintains the plane direction of the base substrate so as to be deposited as a monocrystal in the (111) plane or in the (110) plane.

A SiGe film can be formed according to a variety of known methods such as, for example, a CVD method, a sputtering method, a vacuum vapor deposition method, an MEB method. In particular, formation as a result of epitaxial growth according to a CVD method is preferable. The film formation conditions for this case can be selected from among the conditions known in this field and, in particular, it is preferable for the film formation temperature to be approximately 700° C., or lower, and, furthermore, to be 550° C., or lower. Here, the deposition temperature must be low in order to deposit a film having a high concentration of Ge that is as thick as possible so that strain energy is accumulated in the SiGe film.

Though the concentration of Ge in this SiGe film is not particularly limited, a concentration of Ge of from approximately 10 atom % to 50 atom % and, more preferably, from 10 atom % to 40 atom % can be cited as examples. Here, though the concentration of Ge may be changed in a continuous manner or in a step-by-step manner in the direction of the film thickness and in the direction toward the surface of the layer (in the direction inwards from the surface), it is preferable for the concentration of Ge to be uniform.

It is necessary to set the film thickness of the SiGe film so that slippage dislocation at the interface between the SiGe film and the silicon substrate that can occur in a subsequent annealing process for release of strain does not negatively affect the semiconductor device, for example a MOSFET, that is formed on the SiGe film. For example, the critical film thickness of a SiGe film having compressive stress is determined as a function of the concentration of germanium and the deposition temperature. In the case wherein a film thickness exceeding the critical film thickness is adopted, a misfit dislocation occurs due to release of stress at the interface between the silicon substrate and the SiGe film and dislocation lines in cross-hatched forms occur on the surface thereof and the quality of the crystal of a semiconductor film formed on top of that is lowered due to this. Accordingly, it is preferable for the film thickness to be less than the critical film thickness. Concretely, a thickness of from approximately 10 nm to 500 nm can be cited. In particular, it is preferable for the film thickness of the SiGe film to be 300 nm, or greater, taking into consideration the formation of a PN junction in the subsequent process.

Here, in the present invention, a silicon film may be formed on the substrate before the SiGe film is formed. It is preferable for this silicon film to be a silicon monocrystal film and this silicon film has a function of preventing the formation of local hillocks and voids due to abnormal growth of the SiGe film formed on top of this silicon film. The silicon film can be formed according to the similar method described above. It is appropriate for the film thickness of the silicon film to be, for example, from approximately 5 nm to 50 nm.

Next, ion implantation and annealing treatment are carried out.

It is preferable to select appropriate ion species for ion implantation so that crystal defects do not remain in the SiGe film through which ions pass, so that the nuclear blocking performance becomes of the maximum immediately before the average range (Rp) wherein the ions stop so as to introduce crystal defects in the vicinity of the average range (implantation peak) and so that the device is not electrically affected in the process, including in the below described annealing. Accordingly, elements having a low mass, in particular hydrogen or helium, are preferable. That is to say, light elements are used for ion implantation and, thereby, buried crystal defects can be introduced into the implantation region without a conversion to the amorphous state.

Here, a technology (brittleness breakage technology) is described in IEICE Trans. Electron., E80-C, 358 (1997) wherein a hydrogen ion implantation into a UNIBOND, which is a combined SOI wafer, is applied as a technology for introducing crystal defects by means of ion implantation and, thereby, microscopic defects are introduced and are grown so as to become a cluster of defects by means of the subsequent annealing treatment and, then, the SOI wafer is Smart Cut. Though here a dose of 5, or greater, $\times 10^{16}$ cm$^2$ is used for the purpose of the Smart Cut, a dose of from approximately $1 \times 10^{16}$ cm$^2$ to $5 \times 10^{16}$ cm$^2$ is preferable as a dose that allows the introduction of crystal defects without the introduction of a Smart Cut in the present invention.

It is effective to set the average range (Rp) of ions that are ion implanted at a value that is greater than the film thickness of the SiGe film deposited on a silicon substrate or a value that is greater than the total film thickness of a silicon film and a SiGe film in the case wherein the silicon film is formed on a silicon substrate and the SiGe film is formed on top of the silicon film. In addition, a correlation between the position of the buried crystal defects formed by means of the below described annealing after ion implantation and the crystal defects on the surface of the SiGe film was recognized. Furthermore, extension of the dislocation lines from the buried crystal defects to the SiGe film was confirmed. Accordingly, reduction in crystal defects that extend to the surface of the SiGe film can be achieved by setting the position of the buried crystal defects at a position below the interface between the SiGe film and the silicon substrate or below the interface between the silicon film and the silicon substrate. On the other hand, in the case wherein Rp is shallow, buried crystal defects occur in the vicinity of Rp and, in addition, secondary defects newly occur at the interface between the silicon substrate and the SiGe film or at the interface between the silicon substrate and the silicon film due to the above buried crystal defects and, thereby, the flatness of the surface of the SiGe film, in addition to the penetrating dislocations, is lowered. Accordingly, it is desirable to set the average range of ion implantation to be in a range from the interface between the silicon substrate and the SiGe film or the interface between the silicon substrate and the silicon film to position 300 nm below the interface, taking into consideration the correlative behavior opposite to the release in strain in the SiGe film due to crystal defects and reduction in crystal defects on the surface. Thus, the acceleration energy for ion implantation can be appropriately adjusted based on the ion species used, the film thickness of the SiGe film, the existence of the silicon film, the film thickness thereof, and the like, and an implantation energy of from approximately 20 keV to 150 keV, preferably from approximately 30 keV to 35 keV, for example, can be cited.

Furnace annealing, lamp annealing, RTA, and the like, for example, can be cited as heat treatments that can be carried out in a temperature range of from 700° C. to 950° C. for from approximately 10 to 30 minutes under an inert gas atmosphere (argon, or the like), under a normal atmosphere, under a nitrogen gas atmosphere, under an oxygen gas atmosphere, under a hydrogen gas atmosphere, and the like.

Here in the present invention a second SiGe film can be formed on top of the SiGe film after ion implantation and annealing have been carried out as described above and the SiGe film in its ultimate form may be formed of a plurality of layered films. The second SiGe film formed here can be formed by the same method as described above so as to have the same film thickness. This second SiGe film may be formed of a plurality of layered films having the same or different concentrations of Ge.

Furthermore, a semiconductor film is formed on the SiGe film. The semiconductor film is formed on the SiGe film, wherein strain has been relieved and, therefore, the semiconductor film has intrinsic strain. The semiconductor layer is not specifically limited as long as it has a diamond structure in the same manner as silicon and Si, SiC, or a SiGe film having a concentration of Ge that is lower than that of the above described SiGe film can be cited. In particular, a silicon film is preferable. The concentration of C in the SiC is not specifically limited but, rather, a concentration of from approximately 0.1 atom % to 7 atom % can be cited. In addition, it is appropriate for the concentration of Ge in the SiGe to be approximately 10 atom %, or lower. The semiconductor film can be formed by the same method as that for the SiGe film and, for example, it is preferable to form, subsequent to the formation of the SiGe film, the semiconductor film in the same unit as is used for the SiGe film by changing the growth gases. Thereby, pollution from oxygen, or the like, of the surface of the SiGe film can be reduced. It is preferable for the temperature of the substrate in this case to be from approximately 400° C. to 650° C. It is preferable for the film thickness of the semiconductor film to be great, taking into consideration: reduction in the thickness of the film in subsequent manufacturing processes for the semiconductor device; diffusion of Ge from the SiGe film; and the like, while it is preferable to form the film so as to have a film thickness of the critical film thickness, or less, in order to suppress the occurrence of defects due to tensile strain of the semiconductor film that occurs after the process of relieving strain of the SiGe film. Here, it is preferable to make the semiconductor film thinner as the concentration of germanium of the SiGe film is increased and it is preferable to make the semiconductor film thinner as the temperature for heat treatment that is subsequently carried out in the manufacturing process for a semiconductor device is increased. A film thickness of from approximately 1 nm to 100 nm, more preferably, from approximately 5 nm to 30 nm, can be concretely cited. Here, this semiconductor film may be formed of a plurality of layered films having the same, or different, components.

Thereby, a SiGe film with no dislocations wherein the stress has been relieved can easily be formed and a semiconductor film formed on top of that can be made a strained semiconductor film of a good quality with sufficient strain so that the targeted increase in the mobility of the carriers can be achieved in the case wherein a semiconductor device is formed using the gained substrate.

In addition, the semiconductor film of the present invention in the semiconductor substrate gained in the above described manner is used as an active layer (channel) while the surface of this semiconductor film undergoes radical oxidation using radicals of ozone or oxygen and, thereby, a gate oxide film is formed. That is to say, the poor film characteristics of a gate oxide film in the (111) plane, wherein the insulation breakdown withstand voltage is low, can be improved by adopting a novel oxidation technology represented by the radical oxidation technology reported in recent years in IEDM Tech. Dig., p 249, 1999, though the poor electrical insulation characteristics of a gate oxide film formed on silicon in the (111) plane direction have so far been problematic. Therefore, the conditions, and the like, for radical oxidation can be selected in accordance with the report in this reference.

Here, a gate electrode is formed according to a known method after formation of the gate oxide film and, then, source/drain regions are formed by means of ion implantation and, thereby, a semiconductor device can be completed. In addition, this semiconductor device may have an LDD structure or a DDD structure. Thereby, a semiconductor device having excellent electrical characteristics can be gained.

Carrier mobility in the semiconductor layer (for example, silicon layer) in the (111) plane direction having tensile strain, which has been formed in the above described manner, is approximately 1.5 times as high as that of unstrained silicon in the (100) plane direction in the case of an NMOS and is approximately 2 times as high as that of unstrained silicon in the (100) plane direction in the case of a PMOS.

In the following a manufacturing method for a semiconductor substrate and a manufacturing method for a semiconductor device according to the present invention are described in detail in reference to the drawings.

Embodiment 1

As shown in FIG. 1(a), a monocrystal silicon substrate 1 in the (111) crystal plane direction is washed according to a known method. A SiGe film 2 having a concentration of Ge of 25 atom % and having strain is epitaxially grown on this silicon substrate 1 at 520° C. so as to have a film thickness of 300 nm.

Figure 1B:
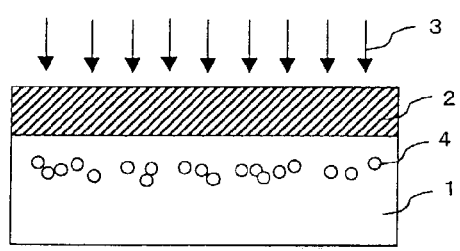

Next, as shown in FIG. 1(b), hydrogen ions 3 are ion implanted into silicon substrate 1 with an energy of 30 keV and with a dose of $3\times10^{16}$ cm$^2$ so that the implantation range (Rp) of the ions reaches from the interface between strained SiGe film 2 and silicon substrate 1 into silicon substrate 1, side, that is to say, to a depth into the silicon substrate of 50 mn from the interface. This ion implantation introduces microscopic defects 4 to the vicinity of Rp without destruction of the crystal and without leaving defects on the surface side of the substrate that has been implanted with ions.

Figure 1C:
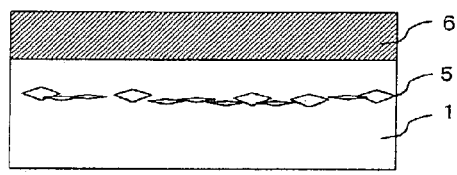

Then, as shown in FIG. 1(c), annealing treatment is carried out on silicon substrate 1 under an inert atmosphere at a temperature of 80° C. for 10 minutes. Microscopic defects 4, which have been introduced into silicon substrate 1, are converted into a cluster 5 of defects according to this treatment.

That is to say, the angles between covalent bonds of silicon are partially altered due to microscopic defects introduced by means of ion implantation so that a high energy state is gained. It is thought that the hydrogen remaining in the lattice is captured by these microscopic defect portions of a high energy state and hydrogen reacts with silicon by means of thermal energy during annealing so that Si—H bonds are created and Si—Si bonds are sequentially severed and, then, this reaction loop is repeated so as to form cluster 5 of defects. Then the silicon substrate body and the silicon region between the defects and the SiGe film interface in the crystal are "severed" from each other at the time of the formation of cluster 5 of defects. In the case wherein the strain energy accompanying the lattice mismatch of the adjacent SiGe film 2 becomes greater than the lattice energy of this silicon layer in this "severed silicon region," the strain energy of SiGe film 2 is relieved through the reception of thermal energy during annealing so that SiGe film 2 is converted into unstrained SiGe film 6. That is to say, the relief of the strain of the SiGe film is determined according to the size of the above described lattice energy of the region of the "severed silicon layer" between the defects and the SiGe interface as well as of the lattice strain energy of SiGe film 2. Accordingly, the thickness of the severed silicon region between the defects and the SiGe film interface should be as small as possible in the case wherein only the relief of lattice strain of SiGe film 2 is considered. That is to say, the ion implantation range Rp of FIG. 1(b) should be as shallow as possible from the interface between the SiGe film and silicon substrate 1.

On the other hand, it was confirmed that some penetrating dislocation lines reach into SiGe film 2 from cluster 5 of defects, which are generated through conversion during annealing. Measures such that 1) SiGe film 2 is deposited to have a great thickness, 2) cluster 5 of defects is generated at a distance away from the interface between SiGe film 2 and silicon substrate 1, and the like, can be considered in order to prevent these dislocation lines from extending to the surface of SiGe film 6. However, measure 1) is limited according to the critical film thickness and only measure 2) should be carried out. Accordingly, the ion implantation range Rp is determined from the tradeoff relationship between the above described relief of strain of SiGe (reduction in the thickness of the silicon film) and reduction in the defects on the surface thereof (increase in the thickness of the silicon film).

The degree of relief of strain in unstrained SiGe film 6 is analyzed by means of an X-ray diffraction analysis (XRD) using a substrate that has been processed and manufactured as described above and, then, it was confirmed that 90% of the strain energy was relieved and that the SiGe film was converted to an approximately unstrained condition. In addition, it was confirmed through analysis using a Nomarski phase contrast microscope or a scanning electron microscope (SEM) that the number of penetrating dislocation lines extending from cluster 5 of defects to the surface of unstrained SiGe film 6 was from few to nearly negligible.

Figure 1D:
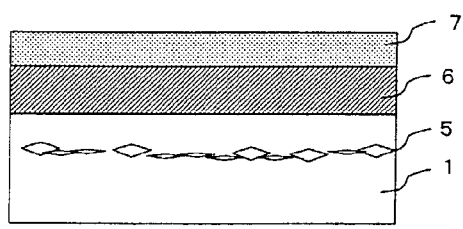

Next, as shown in FIG. 1(d), a silicon monocrystal film 7 is epitaxially grown at a temperature of 700° C. so as to have a film thickness of approximately 20 nm above silicon substrate 1, on which unstrained SiGe film 6 has been formed. A silicon substrate in the (111) plane direction is used as a starting substrate material for the silicon monocrystal film 7 and the plane direction is sequentially transferred so that the plane direction of this silicon monocrystal film 7 also becomes of (111).

The existence of film strain in silicon monocrystal film 7 is determined according to the size of the lattice energy of this silicon monocrystal film 7 and that of unstrained SiGe film 6 directly beneath the silicon monocrystal film. It is necessary for silicon monocrystal film 7 to have tensile strain for the purpose of application to a device.

A semiconductor substrate having a strained silicon film formed on the surface was manufactured according to the foregoing steps.

Figure 1E:
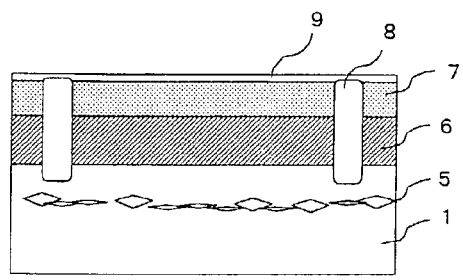

Then, as shown in FIG. 1(e), an element isolation layer 8 is formed according to a known method utilizing the gained silicon substrate 1. In addition, a gate oxide film 9 is formed by oxidizing the surface of the gained silicon substrate 1 within a plasma sheath wherein a mixed gas of Kr and oxygen is converted to plasma at 400° C. so that a 4.5 nm gate oxide film 9 is formed. The withstand voltage characteristics of a gate oxide film can be improved so as to solve the problem with silicon in the (111) plane by adopting such radical oxidation.

Figure 1F:
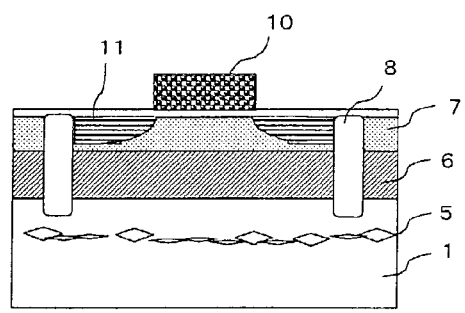

After that, as shown in FIG. 1(f), a gate electrode 10 and source/drain regions 11 are formed according to a known method so that a MOS transistor having a channel in tensilely-strained silicon is manufactured.

The mobility of the carrier in the gained transistor was evaluated and it was confirmed that the mobility of both electrons as well as holes was increased in comparison with that in a transistor having a channel in unstrained silicon, as shown in Table 1.

TABLE 1

| Channel material and plane direction | Mobility ($cm^2/sv$) | |
|---|---|---|
| | Electrons | Holes |
| Unstrained silicon (100) | 500 | 100 |
| Unstrained silicon (111) | 350 | 150 |
| Tensilely-strained silicon (111) | 700 | 210 |

Embodiment 2

Figure 2A:
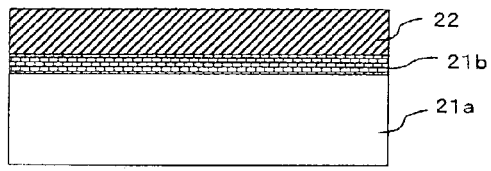
FIG. 2(a) to (e) are principal schematic cross sectional views for explaining a manufacturing method for a semiconductor substrate according to the present invention.

As shown in FIG. 2(a), A monocrystal silicon substrate 21a in the (111) crystal plane direction was washed according to a known method. A silicon monocrystal film 21b was epitaxially grown on silicon substrate 21a to have a thickness of 5 nm and a strained SiGe film 22 having Ge of 25 atom % was epitaxially grown on the film 21b to have a thickness of 300 nm. The temperature at the time of deposition was set at 520° C. In addition, in contrast to the above described Embodiment 1, silicon monocrystal film 21b was deposited in order to suppress local hillocks and voids due to abnormal SiGe growth. Moreover, though a silicon film was deposited on a silicon substrate in the above described embodiment, strained SiGe film 22 containing a concentration of germanium of 25 atom % may be epitaxially grown directly on the silicon substrate in the same manner as in Embodiment 1 so as to have a thickness of 300 nm.

Figure 2E:
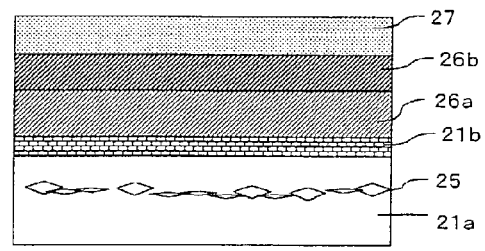
Figure 2B:
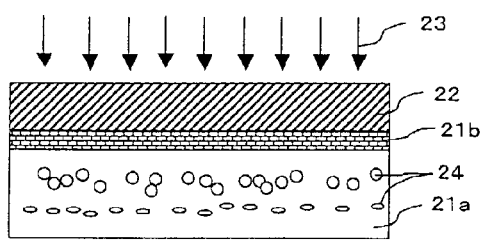

Next, as shown in FIG. 2(b), two layers of microscopic defects 24 due to ion implantations were introduced inside of the gained silicon substrate 21a. Under first ion implantation conditions of 30 keV, hydrogen ions 23 were implanted to a first implantation range in the silicon substrate, beneath the interface between SiGe film 22 and the silicon substrate, of approximately 50 nm. Under second ion implantation conditions of 38 keV, hydrogen ions 23 were implanted to a second implantation range in the silicon substrate, beneath the interface between SiGe film 22 and the silicon substrate, of approximately 100 nm. The implantation amount was set at $2 \times 10^{16}$ $cm^2$ for each implantation under the respective energy conditions.

The purpose of forming two layers of microscopic defects 24 is to reduce the amount of the first ion implantation, which has Rp close to the SiGe film interface, so that the density of penetrating dislocations that occur in the subsequent step is reduced and to supplement the stress relief effects of SiGe film 22, which have been weakened due to the reduction in the amount of the first implantation, with effects from the second ion implantation.

Figure 2C:
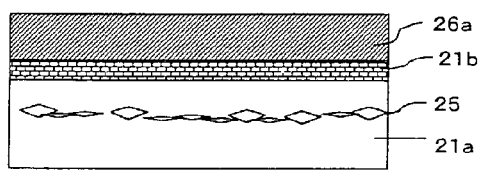

Then, as shown in FIG. 2(c), an annealing treatment was carried out on the gained silicon substrate 21a under an inert atmosphere at a temperature of 800° C. for 10 minutes. This treatment converts microscopic defects 24, which were introduced into silicon substrate 21a, into cluster 25 of defects. At the same time the strain energy is relieved from SiGe film 22 when thermal energy is received during annealing so that SiGe film 22 is converted into unstrained SiGe film 26a.

Figure 2D:
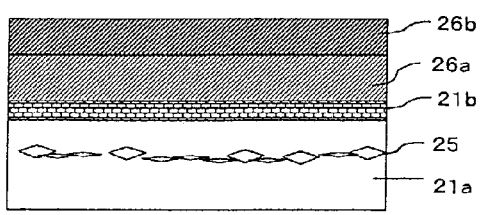
Figure 3:
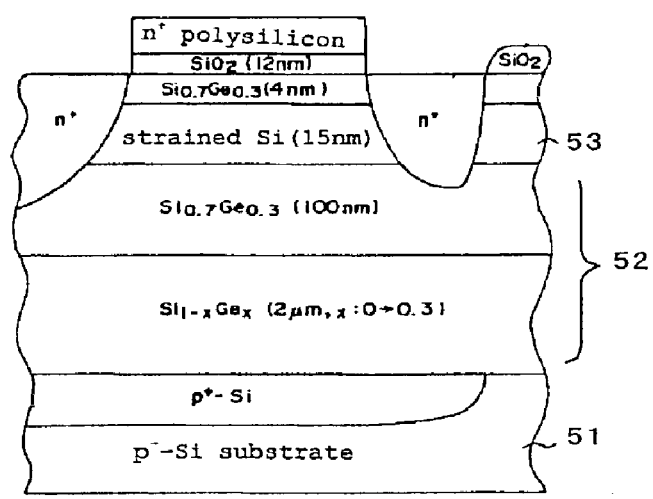
FIG. 3 is a principal schematic cross sectional view of a semiconductor substrate according to the prior art.

Next, as shown in FIG. 2(d), second SiGe film 26b was epitaxially grown on unstrained SiGe film 26a and, furthermore, silicon monocrystal film 27 was epitaxially grown on top of that in a sequential process, as shown in FIG. 2(e).

In this second embodiment, the strain was already relieved from the base SiGe film 26a and, therefore, second SiGe film 26b becomes a SiGe film to which the (111) plane direction is transferred and in which the strain has been relieved while silicon monocrystal film 27 becomes a strained silicon film having tensile strain. The elimination of penetrating dislocations that have expanded to the surface of SiGe film 26a, which becomes the seed surface for epitaxially growth, is advanced due to the additional deposition according to this sequential process of second SiGe film 26b and, therefore, this contributes to the formation of a silicon monocrystal film 27 with virtually no dislocations.

Although the degree of freedom of temperature control at the time of film deposition is great in comparison with that at the time of the deposition of first SiGe film 26a, temperature control is restricted at the time of film deposition at high temperature due to the occurrence of thermal diffusion of germanium atoms from SiGe films 26a and 26b into silicon film 21b side. No problem arises in the case wherein the temperature at the time of deposition is in a range of from 500° C. to 800° C. In the present embodiment the temperature was set at 520° C. and SiGe film 26 was deposited to have a thickness of 300 nm and silicon monocrystal film 27 was deposited to have a thickness of 20 nm.

A semiconductor substrate with a strained silicon film formed on its surface was manufactured according to the foregoing steps.

A transistor was manufactured using this silicon substrate 21a in the same manner as in Embodiment 1 in order to evaluate carrier mobility and the same improvements as in Embodiment 1 were confirmed concerning both electron and hole mobility.

Thus a SiGe film without dislocations wherein stress has been relieved can easily be formed in accordance with a manufacturing method having a sequence of steps wherein: a substrate having a silicon layer in the (111) or (110) plane direction with a high atomic density is used; a compressed strained SiGe film is deposited; buried crystal defects are introduced by means of ion implantation and annealing; compressed strain is relieved from the SiGe film; and a semiconductor film having tensile strain is deposited and a high quality semiconductor film deposited on top of the upper layer can be provided with sufficient tensile strain.

In addition, in the case where a semiconductor device is manufactured by using such a semiconductor substrate and by forming a gate insulator film by means of radical oxidation, deterioration in the quality of the gate oxide film is avoided, the electrical insulation characteristics of the gate oxide film can be improved and carrier mobility can be greatly improved that in the unstrained semiconductor substrate in the (100) plane direction so that it becomes possible to provide a semiconductor device with a low operating voltage and of a low power consumption, which cannot be achieved by a conventional device.

What is claimed is:

1. A manufacturing method for a semiconductor substrate comprising the steps of:
    forming of a SiGe film on a substrate having at least a surface comprised of a silicon monocrystal layer in the (111) or (110) plane direction;
    introducing buried crystal defects within the substrate by ion implantation and annealing;
    forming a semiconductor film on the SiGe film;
    forming a second SiGe film on the SiGe film after the ion implantation and annealing but before the formation of the semiconductor film.

2. A manufacturing method for a semiconductor substrate comprising the steps of:
    forming of a SiGe film on a substrate having at least a surface comprised of a silicon monocrystal layer in the (111) or (110) plane direction;
    introducing buried crystal defects within the substrate by ion implantation and annealing;
    forming a semiconductor film on the SiGe film;
    using ion seeds comprising ions of hydrogen or helium for the ion implantation.

3. A manufacturing method for a semiconductor substrate comprising the steps of:
    forming of a SiGe film on a substrate having at least a surface comprised of a silicon monocrystal layer in the (111) or (110) plane direction;
    introducing buried crystal defects within the substrate by ion implantation and annealing;
    forming a semiconductor film on the SiGe film;
    forming a gate oxide film using ozone or oxygen radicals on a surface of the semiconductor film.

4. A manufacturing method for a semiconductor substrate comprising the steps of:
    forming of a SiGe film on a substrate having at least a surface comprised of a silicon monocrystal layer in the (111) or (110) plane direction,
    introducing buried crystal defects within the substrate by ion implantation and annealing,
    forming a semiconductor film on the SiGe film,
    forming a transistor by:
    forming an oxide film and gate electrode on the semiconductor film,
    forming source/drain regions in the semiconductor film,
    wherein a channel of the transistor is provided in a portion of the semiconductor film which is tensilely-strained due to the buried crystal defects.

5. A manufacturing method for a semiconductor substrate comprising the steps of:
    forming of a SiGe film on a substrate having at least a surface comprised of a silicon monocrystal layer in the (111) or (110) plane direction,
    introducing buried crystal defects within the substrate by ion implantation and annealing, an implantation range of the ions being determined in dependence upon relief strain of the SiGe film and reduction of defects at an interface of the SiGe film and the surface of the substrate;
    forming a semiconductor film on the SiGe film.

* * * * *